United States Patent
Karg et al.

(10) Patent No.: US 7,825,486 B2
(45) Date of Patent: Nov. 2, 2010

(54) MEMORY CELL AND MEMORY DEVICE

(75) Inventors: Siegfried Friedrich Karg, Adliswil (CH); Gerhard Ingmar Meijer, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 101 days.

(21) Appl. No.: 12/353,315

(22) Filed: Jan. 14, 2009

(65) Prior Publication Data

US 2009/0179245 A1 Jul. 16, 2009

(30) Foreign Application Priority Data

Jan. 16, 2008 (EP) .................. 08100565

(51) Int. Cl.
*H01L 43/10* (2006.01)

(52) U.S. Cl. .............. 257/421; 257/E43.004; 257/E43.005

(58) Field of Classification Search ........... 257/421, 257/E43.004, E43.005
See application file for complete search history.

(56) References Cited

U.S. PATENT DOCUMENTS

| | | | |
|---|---|---|---|
| 5,184,500 A | 2/1993 | Krcma | |
| 5,640,343 A | 6/1997 | Gallagher | |
| 6,114,199 A | 9/2000 | Isobe | |
| 6,337,237 B1 | 1/2002 | Basceri | |
| 6,527,828 B2 | 3/2003 | Flippo | |
| 6,579,756 B2 | 6/2003 | Basceri | |
| 6,673,669 B2 | 1/2004 | Basceri | |
| 6,737,716 B1 | 5/2004 | Matsuo | |
| 6,815,744 B1 | 11/2004 | Beck | |
| 6,861,718 B2* | 3/2005 | Sato et al. | 257/423 |
| 7,391,641 B2* | 6/2008 | Sharma et al. | 365/158 |
| 2002/0048186 A1 | 4/2002 | Allenspach et al. | |
| 2002/0106853 A1 | 8/2002 | Basceri | |
| 2002/0170429 A1 | 11/2002 | Flippo | |
| 2003/0089603 A1 | 5/2003 | Scheer | |
| 2003/0143801 A1 | 7/2003 | Basceri | |
| 2004/0217403 A1* | 11/2004 | Drewes | 257/298 |
| 2005/0152075 A1* | 7/2005 | Miyazawa et al. | 360/324 |
| 2006/0044863 A1 | 3/2006 | Basceri | |
| 2006/0055745 A1 | 3/2006 | Yagi | |
| 2006/0246740 A1 | 11/2006 | Cartier | |
| 2006/0255400 A1 | 11/2006 | Basceri | |
| 2007/0080384 A1* | 4/2007 | Noh et al. | 257/295 |
| 2008/0175032 A1* | 7/2008 | Tanaka et al. | 365/51 |
| 2009/0027955 A1* | 1/2009 | Koh et al. | 365/163 |

FOREIGN PATENT DOCUMENTS

EP 1256958 11/2002

* cited by examiner

*Primary Examiner*—Allan R Wilson
(74) *Attorney, Agent, or Firm*—Vazken Alexanian

(57) ABSTRACT

A programmable magnetoresistive memory cell. The memory cell has a magnetic element that includes a first and a second ferromagnetic layer. The first and second ferromagnetic layers are separated by a non-ferromagnetic and preferably electrically insulating spacer layer. The data bit is read out by measuring the electrical resistance across the magnetic element. The memory cell further includes: a third ferromagnetic layer having a well-defined magnetization direction and a resistance switching material having a carrier density. The carrier density can be altered by causing an ion concentration to become altered by means of an applied electrical voltage signal. Thus, the carrier density can be switched between a first and second state.

12 Claims, 3 Drawing Sheets

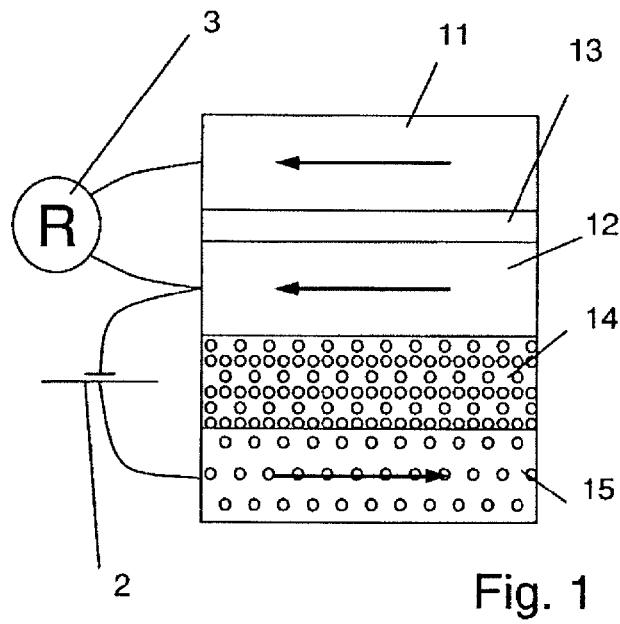
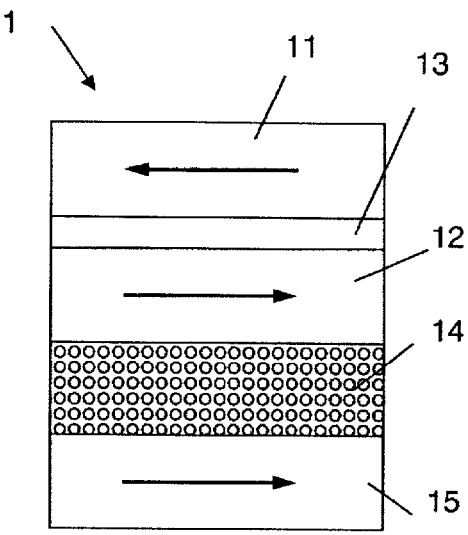
Fig. 1
Fig. 2
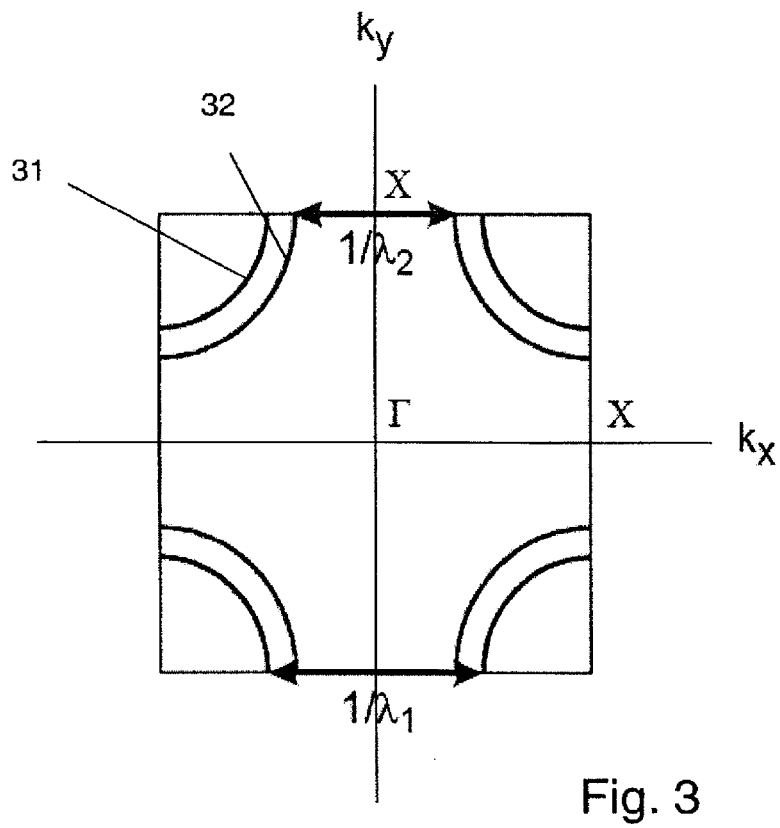
Fig. 3

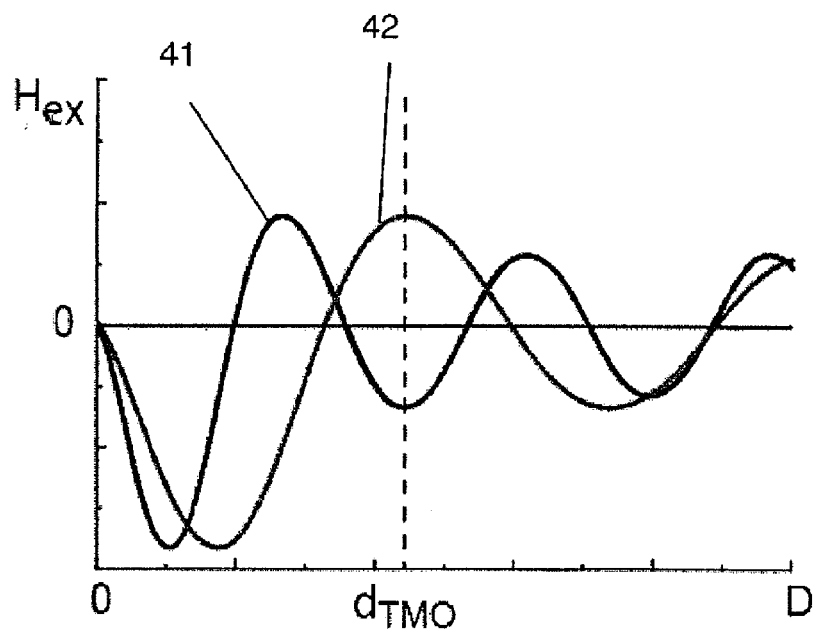
Fig. 4c
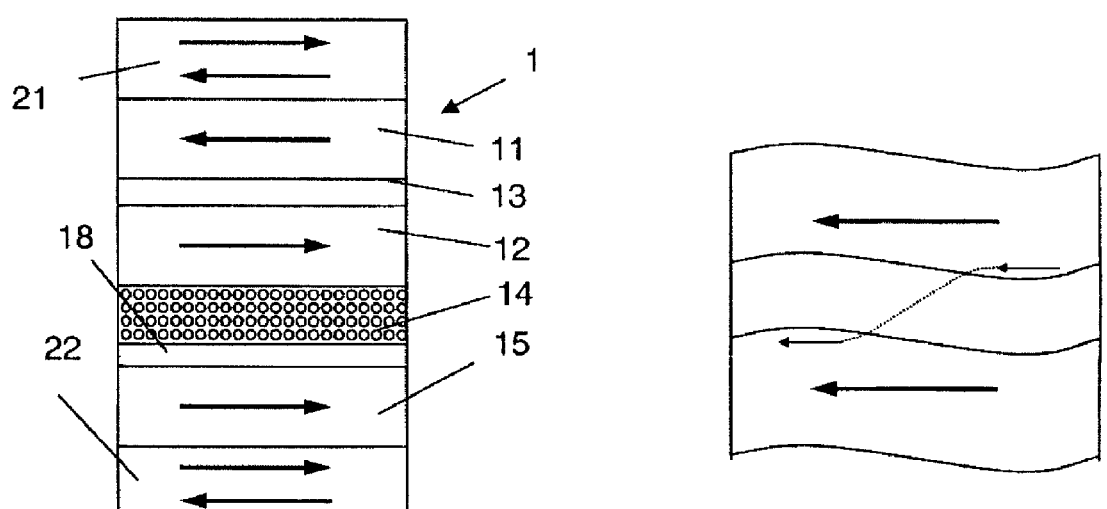
Fig. 5
Fig. 6

MEMORY CELL AND MEMORY DEVICE

CROSS-REFERENCE TO RELATED APPLICATIONS

This application claims priority under 35 U.S.C. §119 from European Patent Application No. 08100565.4 filed Jan. 16, 2008, the entire contents of which are incorporated herein by reference.

BACKGROUND OF THE INVENTION

1. Field of the Invention

The invention is in the field of programmable memory cells for random access memories (RAM) and relates to a programmable magnetoresistive memory cell and a RAM memory device comprising such a memory cell.

2. Description of the Related Art

Magnetoresistive Random Access Memory (MRAM) is a non-volatile memory technology that has, for example, been disclosed in U.S. Pat. No. 5,640,343. According to this technology, memory cells include a magnetoresistive element, for example, an anisotropic magnetoresistive (AMR) element, a metallic multilayer element exhibiting the giant magnetomagentoresistance (GMR) effect, or a multilayer element with a magnetic tunnel junction (MTJ) exhibiting the Tunneling Magnetoresistance (TMR).

Because of certain restraints of AMR and GMR memory cells, currently MTJ based technologies are preferred and MRAM devices on the market incorporate MTJ memory cells.

Information bits in both GMR and TMR based memory cells are defined by the relative orientation of the magnetization of two distinct ferromagnetic layers separated by a spacer layer in a memory cell. In a GMR cell, the spacer layer is a non-magnetic metal, whereas, for TMR cells, the spacer layer is electrically insulating and constitutes a tunneling barrier for electrical currents from one ferromagnetic layer to the other one. For example, a logical "1" may correspond to a configuration where the magnetization of the two ferromagnetic layers is parallel, whereas the logical "0" may be defined by the configuration where the magnetization is antiparallel, or vice versa.

The state of the memory cell is determined ("read" operation) by measuring the electrical resistance perpendicular to the layer plane (TMR or GMR based memory cells) or along the layer plane (GMR based memory cells).

Of the two ferromagnetic layers, one is caused to have a well-defined magnetization direction. In this "hard" magnetic layer, the magnetization may be lastingly influenced at most by a very high magnetic field and a field higher than applied during normal operation. For example, the hard magnetic layer may be coupled to an antiferromagnetic (AF) layer. This hard magnetic layer is often also called the "fixed ferromagnetic" layer or "pinned ferromagnetic layer". The other one of the two ferromagnetic layers has a substantially lower effective coercivity (i.e. the coercivity including influences of the layer's environment such as of pinning etc.) and is called the "soft ferromagnetic layer".

For a "write" operation, the magnetization of the soft ferromagnetic layer has to be switched. To this end, several approaches have been proposed. A first and most simple approach relies on the generation of a magnetic field sufficient to change the magnetization direction of the soft ferromagnetic layer by causing electrical currents to flow through two perpendicular contact lines above and below the memory cell. This approach is advantageous in being the most simple, however, it requires the coercivity of the soft ferromagnetic layer to be very well defined and, with increasing scaling down in size, the probability of false writes of neighboring memory cells increases.

Other approaches for "write" operations have been proposed, including the "toggle mode" that also requires the application of a magnetic field and the "spin torque transfer", but they also suffer from drawbacks. Especially, all proposed "write" operations require relatively large write currents. The drawbacks of the "write" operations may be one of the reasons why MRAM devices, although developed more than ten years ago, so far have only been a niche product on the market.

It is therefore desirable to provide an MRAM memory cell overcoming drawbacks of prior art MRAM memory cells and enable improved "write" operations compared to prior art MRAM memory cells.

SUMMARY OF THE INVENTION

The present invention provides a non-volatile memory cell. The non-volatile memory cell includes: a first ferromagnetic layer having a defined magnetization direction; a second ferromagnetic layer having a magnetization direction; a non-magnetic spacer layer between the first ferromagnetic layer and the second ferromagnetic layer; a third ferromagnetic layer having a defined magnetization direction; and a resistance switching material between the second ferromagnetic layer and the third ferromagnetic layer.

The relative orientation of the magnetization directions of the first and second ferromagnetic layers define a value of stored information.

The resistance switching material has a charge carrier density that is reversibly switchable between different carrier density states by an applied electrical voltage signal. The different carrier density states cause different effective magnetic exchange couplings between the second ferromagnetic layer and the third ferromagnetic layer, thereby causing different magnetization directions of the second ferromagnetic layer.

Only small electrical currents and small energies are necessary. This is not only advantageous concerning the energy consumption of a memory device but it also makes a denser and better scalable RAM possible.

BRIEF DESCRIPTION OF THE DRAWINGS

In the following, embodiments of the invention will be described referring to accompanying drawings. The drawings are all schematic and not to scale. In the drawings, same reference numerals refer to same or corresponding elements.

FIG. 1 illustrates a layered structure of a memory cell according to the invention in a first state;

FIG. 2 illustrates the structure of FIG. 1 in a second state;

FIG. 3 illustrates the spanning vector of the Fermi surface of a resistance switching material for two different carrier concentrations;

FIGS. 4a-4c show exchange coupling oscillations for two different resistance switching material carrier concentrations, with three different scenarios;

FIG. 5 shows a variant of a memory cell with pinning layers and contact lines; and FIG. 6 shows the principle of a magnetostatic bias coupling between two ferromagnetic layers.

DESCRIPTION OF THE PREFERRED EMBODIMENTS

Figure 4A:
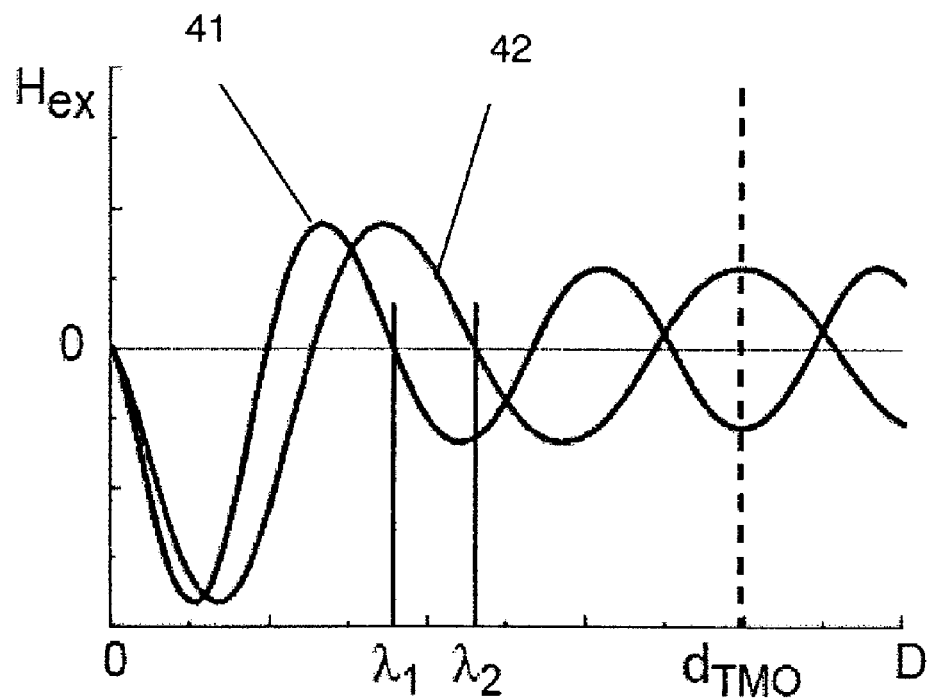

The memory cell according to an aspect of the invention includes a magnetic element that has a first and a second ferromagnetic layer, the relative orientation of the magnetizations of which defines a data bit, the first and second ferromagnetic layers being separated by a non-ferromagnetic, preferably electrically insulating, spacer layer. The data bit can, for example, be read out, as is known in the art of magnetic RAM, by measuring the electrical resistance across the magnetic element, preferably perpendicular to a layer plane. In addition to the magnetic element, the memory cell includes a further, third ferromagnetic layer, the magnetization direction of which is well-defined (i.e. the magnetization direction is fixed during operation of the memory cell), and a resistance switching material, a carrier density of which may be altered by causing an ion concentration to alter by means of an applied electrical voltage signal. By this, the carrier density may be switched between a first and a second state. An effective exchange coupling between the second and the third ferromagnetic layer is subject to the carrier density state. As a consequence switching between the two carrier density states also causes the magnetization of the second ferromagnetic layer to change directions.

For example, the thickness of the second spacer layer, i.e. the layer comprising the resistance switching material, may be chosen such that the effective magnetic exchange coupling between the second ferromagnetic layer and the third ferromagnetic layer changes from ferromagnetic (i.e. favoring parallel magnetizations) to antiferromagnetic (favoring antiparallel magnetizations), or vice versa, upon change of the carrier density from the first to the second state, or vice versa.

According to an embodiment of the invention, a "write" process may be achieved if the second ferromagnetic layer is chosen to be "soft", i.e. the field necessary to change its magnetization direction is smaller than the overall coupling between the magnetizations of the second and third ferromagnetic layers in the first and the second state.

Therefore, in contrast to state-of-the-art MTJ memory cells, no magnetic fields and no high currents have to be applied for a "write" operation. Only small electrical currents and small energies are necessary. This is not only advantageous concerning the energy consumption of a memory device but it also makes a denser and better scalable RAM possible. The MRAM technology currently on the market is difficult to scale and has a large cell size area of about $25F^2$, where F is the feature size. Due to the approach of the invention, the technology also becomes more appealing for fast applications such as for computer main memory or even CPU cache.

A suitable and preferred class of materials for the resistance switching material is transition metal oxides, where the ion concentration caused to be altered by the electrical signal is an oxygen concentration. In the following, the change of ion concentration is described to be due to the migration of oxygen vacancies. Especially, materials exhibiting a so-called filling-controlled metal-insulator transition are preferred for the transition-metal-oxide resistance switching material. This class of materials includes $ABO_{3-\delta}$ perovskites, A being an alkaline earth element, a rare earth element, or a combination thereof, and B being a transition-metal element. Examples are lanthanum and/or strontium titanium oxide $(La,Sr)TiO_{3-\delta}$, yttrium and/or calcium titanium oxide $(Y,Ca)TiO_{3-\delta}$, lanthanum and/or strontium manganese oxide $(La,Sr)MnO_{3-\delta}$, or praseodymium and/or calcium manganese oxide $(Pr,Ca)MnO_{3-\delta}$. Further, transition metal oxides that are advantageous for the present invention include corundum, such as, vanadium and/or chromium oxide $(V,Cr)_2O_{3-\delta}$. Other materials that can be used advantageously include binary transition metal oxides such as nickel oxide $NiO_{1-\delta}$ or titanium oxide $TiO_{1-\delta}$.

The resistance switching material of the second spacer layer in at least one of two switching states preferably has metallic properties. The composition of the resistance switching material may be chosen such that in both switching states the material is metallic, thus defining a Fermi surface. Then, in both switching states, an exchange coupling exists between the magnetizations of the first and the second layer. As an alternative, the resistance switching material may preferably be chosen to be metallic in only one of the two states and essentially an insulator in the other state. In this case, in order to give the second ferromagnetic layer a well-defined magnetization direction in both switching states, a coupling bias is caused to act upon the second ferromagnetic layer. The coupling bias, for example, is caused by a weak coupling to an antiferromagnetic intermediate layer, or by a magnetostatic coupling between the second and the third ferromagnetic layer, etc.

Additionally and preferably, the resistance switching material is material with a comparably high mobility of oxygen vacancies of $10^{-9}$ cm$^2$/Vs or higher.

In order to be able to accept or release oxygen vacancies, the resistance switching material layer preferably is in contact with an oxygen ion conducting layer. Also in this ion conducting layer, the mobility of oxygen vacancies is preferably $10^{-9}$ cm$^2$/Vs or higher. The ion conducting layer may be formed by the third ferromagnetic layer or by the second ferromagnetic layer. As an alternative, it may be a thin, metallic, non-magnetic intermediate layer between either the second or third ferromagnetic layer on the one hand and the resistance switching material layer on the other hand.

It has already been proposed to use transition metal oxides with a resistance switching property, also termed programmable-resistance materials, for non-volatile memory devices, see for example U.S. Pat. No. 6,815,744. In such a memory device, electrical pulses of opposite polarity can switch the resistance reversibly and persistently between a low-resistance state and a high-resistance state. However, memory cells based on this technology have been found to exhibit a large statistical spread of the resistance values, both in one cell and from cell to cell. Also, the endurance is limited.

The present invention, in contrast to these state of the art approaches based on programmable-resistance materials, proposes not to use the different resistance values of the programmable resistance material for the read operation but to merely use the exchange coupling between ferromagnetic layers across a programmable resistance material spacer for a write operation.

Additionally, due to the approach according to the invention, the statistical spread in the resistance values across the resistance switching material becomes irrelevant for the "read" operation. This is because the read-out value is dominated by the resistance across the first spacer layer which is dependent on the relative orientation of the first and second ferromagnetic layer magnetizations but is not dependent on the resistance of the resistance switching material. Further, because the memory cells are not exposed to power/temperature spikes, the endurance compared to the programmable resistance material memories (RRAMs) is improved. In regard to the "read" operation, therefore, the memory cells according to the invention share the advantages of the state-of-the-art MTJ memory cells.

Preferably, the memory cell includes at least three contacts (or "terminals") that stack in vertical layers to form two contact pairs so that a first contact pair can test the electrical resistance across the first spacer layer between the first and the second ferromagnetic layers, and a second contact pair can apply voltage pulses across the second spacer. The second of the at least three contacts (i.e. the middle contact) may be directly to the second ferromagnetic layer or it may be to an intermediate layer that is arranged in vicinity to the second ferromagnetic layer and also between the first spacer layer and the second spacer layer.

In principle it would also be possible to provide the memory cell with only two contacts for both the write and read signals. This would, for example, be achieved by two contact lines, one in contact with the first ferromagnetic layer and the other one in contact with the second ferromagnetic layer. In such a configuration the "read" currents preferably are low enough not to cause any migration of the ions in the resistance switching material and the "write" voltage pulses must have substantially higher voltages since the "write" signal is also automatically applied across the insulating first spacer layer. The ferromagnetic and non-magnetic layers of the memory cell according to the invention need not be homogeneous but may optionally themselves consist of layered structures and may, for example, include two sub-layers, sandwich-like structures or multilayers, etc. As an example, the magnetically hard first and/or third ferromagnetic layer may include a sandwich of three layers, namely two ferromagnetic layers separated by a thin metallic, non-ferromagnetic film that antiferromagnetically couples the two ferromagnetic layers. Further, the second ferromagnetic layer (the soft layer) and/or the non-magnetic layers may include a layered structure, for example, permalloy films or a plurality of different sub-layers, respectively. By this approach the second soft ferromagnetic layer may be reversibly switched between a first magnetization state and a second magnetization state by applying an electric signal to the second spacer layer.

Another aspect of the invention concerns a memory device with a plurality of memory cells according to embodiments of the first aspect of the invention. The memory device may be wired so as to be a RAM device, i.e. every memory cell is addressable individually. The memory device may, for example, be used as a dense and fast accessible storage medium of any electronic device or a main memory or a CPU cache of a computer device, etc.

The memory cell 1 of FIG. 1 includes a magnetic element having a first ferromagnetic layer 11, a second ferromagnetic layer 12 and a tunnel barrier illustrated in the embodiment by a first spacer layer 13. The first ferromagnetic layer is a hard ferromagnet, whereas the second ferromagnetic layer is soft. "Hard" in this text means that the effective magnetic fields (including effective exchange coupling fields) present during normal operation of the memory cell are not sufficient to reverse a magnetization direction, whereas the magnetization of "soft" layers can be reversed during normal operation. The difference between the hard and soft ferromagnetic layers may, for example, be achieved by one of the following means, or by combinations thereof:

(i) Material choice: the material(s) of the hard layers may be chosen to have a higher coercivity than the soft layer material;

(ii) Magnetic moment engineering: The hard layer may include a plurality of ferromagnetic layers that are antiferromagnetically coupled and the magnetization direction of which is thus antiparallel so that the total net magnetic moment is small;

(iii) Pinning by an antiferromagnet: The magnetization direction of a ferromagnetic layer in direct contact with an antiferromagnet (such as Fe—Mn) is more difficult to change (pinning can also be advantageous in view of long-term wear so that the magnetization of the respective "hard" layer is prevented from fading away over a long time);

(iv) Induced anisotropy: if a ferromagnetic layer is grown on top of a layer with some lattice mismatch, magnetostriction may contribute to the ferromagnet's an isotropy;

(v) Different effective fields: in the case of the first ferromagnetic layer, the pinning may be achieved by simply causing the first ferromagnetic layer not to be exposed to magnetic fields. This is possible, since due to the approach according to the invention, only an exchange coupling and no physical magnetic field is used for a write process. Exchange coupling is extremely short-range, and exchange coupling between the third and second ferromagnetic layers will not affect the first ferromagnetic layer.

Also other means may be possible. The way in which the ferromagnetic layers are made "hard" and "soft", respectively, is not critical for the invention.

The materials of the first and second ferromagnetic layers and of the spacer layer may be chosen to be any suitable combination, for example, materials in state-of-the-art MRAM devices including magnetic tunneling junctions.

In the figures, the magnetization is depicted, by arrows, to be parallel to the layer plane, i.e. the anisotropy of the layers is assumed to favor an in-plane magnetization. However, the principle of the invention applies equally well to out-of-plane magnetized layers. Also, while the anisotropy of the ferromagnetic layers is assumed to be two-fold (i.e. the magnetization is assumed to be switchable only between two directions), the invention also works with other kinds of anisotropies.

In addition to the mentioned magnetic element, the memory cell includes a further third ferromagnetic layer 15 preferably being harder than the second ferromagnetic layer and a resistance switching material layer 14. In the first state, depicted in FIG. 1, the overall coupling (including the exchange coupling but also other possible contributions to the coupling like magnetostatic coupling, pinholes etc.) between the second and the third ferromagnetic layer is such that the magnetizations are arranged in parallel.

A suitable and preferred class of materials for the resistance switching material layer 14 is transition metal oxides, wherein the ion concentration caused to be altered by the electrical signal is an oxygen concentration. If an electrical signal, such as a voltage pulse, is applied across the resistance switching material layer 14, the concentration of oxygen vacancies in this layer may be altered. For example, oxygen vacancies may be caused to diffuse into the third ferromagnetic layer 15 or may be released by the latter.

As mentioned, materials exhibiting a so-called filling-controlled metal-insulator transition are preferred for the resistance switching material layer 14. From these materials, for example, paramagnetic or diamagnetic transition-metal-oxide materials with a high mobility of oxygen ions are chosen. This class of materials includes $ABO_{3-\delta}$ perovskites, A being an alkaline earth element or a rare earth element or a combination thereof, and B being a transition-metal element. For example, lanthanum and/or strontium titanium oxide (La,Sr)

TiO$_{3-\delta}$, corundum such as vanadium and/or chromium oxide (V,Cr)$_2$O$_{3-\delta}$, and binary transition metal oxides such as nickel oxide NiO$_{1-\delta}$. Upon changing the band filling, for example associated with changing the density of oxygen vacancies, the resistance of these materials is modified.

An especially preferred group of materials is lanthanum and/or strontium titanium oxide (La,Sr)TiO$_{3-\delta}$ because of their strong dependence of the room-temperature resistance on the oxygen stoichiometry.

For the third ferromagnetic layer 15, generally ferromagnetic materials capable of storing and releasing the appropriate quantities of oxygen ions may be used. Examples include ferromagnetic-ordered double-perovskites such as an alkaline-earth chromium rhenium oxide A$_2$CrReO$_6$, an alkaline-earth iron rhenium oxide A$_2$FeReO$_6$, an alkaline-earth iron molybdenum oxide A$_2$FeMoO$_6$, and an alkaline-earth iron tungsten oxide A$_2$FeWO$_6$, where the alkaline-earth A preferably is strontium, calcium or barium, and where A$_2$ may include two same or two different elements of the alkaline-earths. Further examples of materials for the third ferromagnetic layer 15 include ferromagnetic perovskites such as lanthanum and strontium manganese oxide (La,Sr)MnO$_3$.

In the configuration of FIG. 1 (and the following figures where applicable), the first, second and third ferromagnetic layers 11, 12, 15 are contacted. For a "write" operation, a voltage pulse is applied between the second ferromagnetic layer 12 and the third ferromagnetic layer 15, as illustrated by voltage source 2 in FIG. 1. For a "read" operation the electrical tunneling resistance across the first spacer layer 13 is measured, thus the electrical resistance between the first and the second ferromagnetic layer is tested by the resistance measuring device 3. The contacting of different layers in a layer stack by leads is known in the art of memory devices and is not a subject of the present invention and it will not be described here.

In addition to the illustrated layers, the memory cell may in dude further elements such as contact layers, chemical barrier layers, pinning layers etc.

FIG. 2 illustrates the memory cell in its second state where the density of oxygen vacancies in the resistance switching material layer 14 is increased compared to the first state. The transition from the first state to the second state has been induced by applying a voltage pulse across the resistance switching material layer 14, the voltage having the polarity as shown by the voltage source in FIG. 1. Due to the persistently altered charge carrier density, the exchange coupling causes the second, soft ferromagnetic layer 12 to be magnetized in the opposite direction than in the first state illustrated in FIG. 1.

The transition between the first and the second switching state is fully reversible, i.e. by applying a voltage pulse of opposite polarity the oxygen vacancies are caused to persistently migrate back into the configuration shown in FIG. 1.

The physical effect causing the reversal of the magnetization between the first and second states is explained referring to FIGS. 3 and 4*a*-4*c*.

It is a well-established fact that the exchange coupling between ferromagnetic metal layers across a non-ferromagnetic metal layer is an oscillatory function of the thickness of the spacer layers. Theories and experiments of this coupling have shown that the oscillatory behavior is to be attributed to the properties of the Fermi surface of the spacer layer material. More concretely, the spanning vector of the spacer's Fermi surface determines the oscillation period. For example, see M. van Schilfgaarde, F. Herman, S. S. Parkin, and J. Kudrnovský, Theory of Oscillatory Exchange Coupling in Fe/(V,Cr) and Fe/(Cr,Mn), Phys. Rev. Lett. 74, 4063 (1995) and Electrons at the Fermi Surface, edited by M. Springford (Cambridge Univ. Press, Cambridge, 1980).

FIG. 3 shows, in a 2D-model, the Fermi surface of the resistance switching material layer 14 in a reduced zone scheme. The outer lines 31 depict the Fermi surface in the first state (FIG. 1), and the inner lines 32 show the Fermi surface in the second state (FIG. 2). The increased density of oxygen vacancies in the second state compared to the first state leads to an increased density of charge carriers and as a consequence to a shift of the Fermi surface from the outer lines to the inner lines in the reduced zone scheme. As a consequence, the spanning vector as illustrated in the figure is smaller for the second state than for the first state, meaning that the oscillation period, i.e. the wavelength, in the first state is larger for the second state than for the first state.

FIG. 4*a* schematically illustrates the exchange coupling between the second and third ferromagnetic layers as a function of the spacer thickness for the two wavelengths $\lambda_1$ (FIG. 1; represented by a first line 41) and 2 (FIG. 2, represented by a second line 42).

As is usual in the art, the effect of the exchange coupling is represented by a fictitious magnetic field H$_{ex}$, the effect of which on a magnetization corresponds to the effect the exchange coupling has on the named magnetization.

The thickness d of the resistance switching material layer 14, i.e. the transition metal oxide (TMO), may be chosen in FIG. 4*a* to be such that in one of the states there is a clear antiferromagnetic coupling, whereas in the other there is a clear ferromagnetic coupling. The dashed line in FIG. 4*a* shows such a thickness.

Figure 4B:
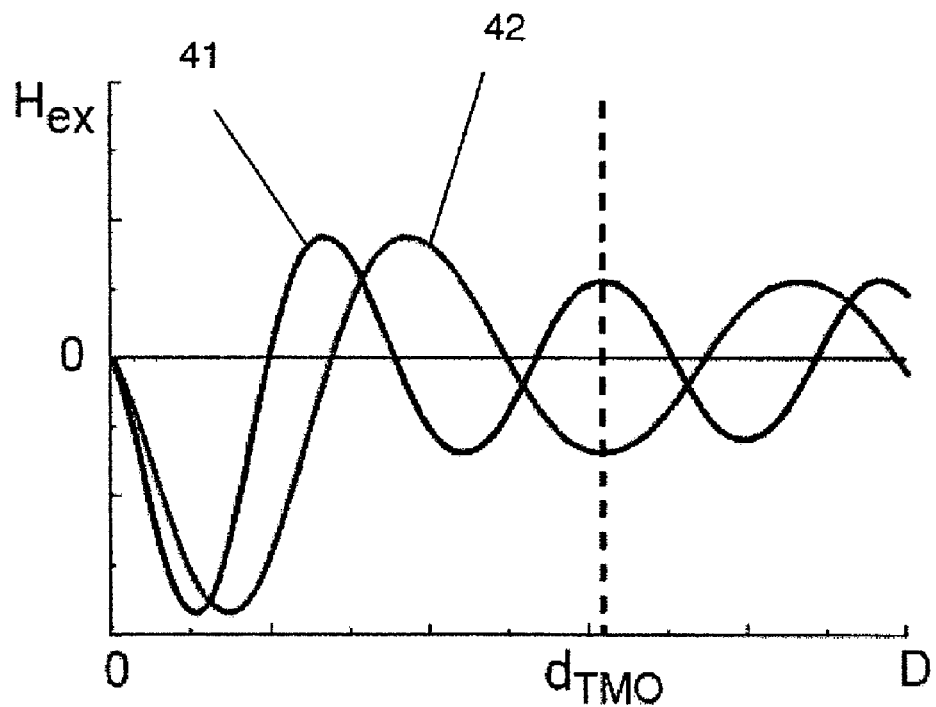

FIGS. 4*b* and 4*c* show variants where the material properties and/or the "write" pulse intensity are different from FIG. 4*a* so that the wavelengths in the first and second states are also different. Under these conditions, it is possible to have an optimal thickness d$_{TMO}$ for the resistance switching material layer 14 at different thickness values and at different maxima/minima of the exchange coupling.

FIG. 5 shows a variant of the memory cell of FIGS. 1 and 2. Firstly, the memory cell includes antiferromagnetic pinning layers 21, 22 pinning the magnetization directions of the first and third ferromagnetic layer by the physical effect of exchange bias. As mentioned previously in this text, instead of the illustrated configuration, only the first or only the third layer can be pinned by an antiferromagnetic layer and/or other means may be used for assuring that the magnetizations of the "hard" ferromagnetic layers are fixed.

As a further difference in FIG. 5 to the embodiment of FIGS. 1 and 2, in addition to the depicted second spacer layer, an intermediate layer 18 is shown. The intermediate layer 18 is also metallic and may, for example, serve as an oxygen ion reservoir for storing oxygen ions and releasing them into the resistance switching material layer 14, instead of the third ferromagnetic layer 15 that then may be of any ferromagnetic material. The exchange coupling in this configuration will take place across both the resistance switching material layer 14 and the intermediate layer 18.

If the charge carrier density in the resistance switching material depends critically on factors such as the applied pulse or growth conditions etc., it may be advisable to tune the memory cell to be robust against variations of charge carrier density both for one cell and between different cells. One way of doing so may be use, as the oxygen mobility material, a material that is essentially non-metallic in a first state and only becomes metallic in a second state. In the first state, there is essentially no exchange coupling between the adjacent ferromagnetic layers. It may, in addition, be possible to provide a small bias favoring a parallel orientation of the two magnetizations, for example, by a magnetostatic coupling.

For example, it is known that for two ferromagnetic layers, a parallel magnetization may be favored if there is a surface that is corrugated and the spacer layer thickness is constant, as illustrated in FIG. 6. The reason is that the magnetic flow is optimized by such a parallel configuration if, due to microscopic sharp edges etc, magnetic field lines exit the ferromagnetic layers into the spacer layer, as illustrated by the dotted line in FIG. 6. If a magnetostatic bias coupling is caused as illustrated, the resistance switching material layer may be chosen such that the exchange coupling in the second state is antiferromagnetic in a broad range of parameters. The switching process is then merely a switching on and off of an exchange coupling between the second and third ferromagnetic layers, wherein the exchange coupling, when switched on, dominates the weaker magnetostatic coupling.

Deviating from the above-described embodiments, further variants may be envisaged. For example, whereas transition metal oxides with migrating oxygen vacancies are a preferred class of resistance switching materials for the second spacer layer, this is not a necessity. Rather, other materials having a charge carrier density of which may be influenced due to migration of ions or even other effects may be used. For example, instead of oxygen ions, hydrogen, lithium, or copper ions may be caused to migrate.

Also, it is not necessary that the third ferromagnetic layer or an intermediate layer serve as the ion conducting layer, as illustrated in the figures. It would equally be possible to cause, in a configuration like in FIGS. 1 and 2, the third ferromagnetic layer to be impenetrable for the oxygen vacancies and to choose a high ion mobility material for the second ferromagnetic layer.

Still other variants are possible. For example, whereas preferably the memory cell is switchable between exactly two states, the data bit being "0" or "1" like in most state-of-the-art memory cells, other configurations where switching is achieved between more than two states may be possible. To this end, the magnetization of the second ferromagnetic layer may be switched between more than two states. Such possibility especially exists if an overall coupling between the second and third ferromagnetic layers is biased by a non-exchange contribution that may be described by an effective field rectangular to the exchange field, for example, a magnetostatic coupling. Also, by purposefully producing a magnetic domain structure, more than two controllable magnetization states may be generated.

While the present invention has been described in detail in conjunction with specific preferred embodiments, it is evident that many alternative, modifications and variations well be apparent to those skilled in the art in light of the foregoing description. It is therefore contemplated that the appended claims will embrace any such alternatives, modifications and variations as falling within the true scope and spirit of the present invention.

What is claimed is:

1. A non-volatile memory cell, comprising:
   a first ferromagnetic layer having a defined magnetization direction;
   a second ferromagnetic layer having a magnetization direction;
   a non-magnetic spacer layer between the first ferromagnetic layer and the second ferromagnetic layer;
   a third ferromagnetic layer having a defined magnetization direction; and
   a resistance switching material between the second ferromagnetic layer and the third ferromagnetic layer;
   wherein the relative orientation of the magnetization directions of the first and second ferromagnetic layers define a value of stored information; and
   wherein the resistance switching material has a charge carrier density that is reversibly switchable between different carrier density states by an applied electrical voltage signal and the different carrier density states cause different effective magnetic exchange couplings between the second ferromagnetic layer and the third ferromagnetic layer, thereby cause different magnetization directions of the second ferromagnetic layer.

2. The memory cell according to claim 1, wherein:
   the memory cell has at least one layer that is an ion conducting layer in contact with the resistance switching material; and
   the ion conducting layer is capable of accepting ions from the resistance switching material and of releasing ions into the resistance switching material depending on a polarity of the voltage signal.

3. The memory cell according to claim 2, wherein the ion conducting layer is at least one of the third ferromagnetic layer, the second ferromagnetic layer, and a metallic intermediate layer.

4. The memory cell according to claim 1, wherein the resistance switching material is a transition metal oxide.

5. The memory cell according to claim 4, wherein the transition metal oxide has a filling-controlled metal-insulator transition.

6. The memory cell according to claim 5, wherein the resistance switching material includes an oxide having at least one of titanium, vanadium, chromium, manganese, iron, cobalt, nickel, and copper.

7. The memory cell according to claim 6, wherein the resistance switching material is selected from the group consisting of $TiO_{1-\delta}$, $V_2O_{3-\delta}$, $NiO_{1-\delta}$, $Cr_2O_{3-\delta}$, and $(La,Sr)BO_{3-\delta}$ where B is a transition metal and $\delta$ is a number that differs for the first and the second state, with $0 \leqq \delta < 1$.

8. The memory cell according to claim 2, wherein the ion conducting layer material exhibits an oxygen vacancy mobility of at least $10^{-9}$ cm$^2$/Vs.

9. The memory cell according to claim 4, wherein the resistance switching material exhibits an oxygen vacancy mobility of at least $10^{-9}$ cm$^2$/Vs.

10. The memory cell according to claim 1, further comprising:
    a first contact to the first ferromagnetic layer;
    a second contract to the second ferromagnetic layer; and
    a third contact to the third ferromagnetic layer;
    wherein a tunneling resistance across the non-magnetic spacer layer is measurable by conducting a current between the first and the second contact; and
    wherein a voltage pulse may be applied between the second and the third contact.

11. A memory device comprising a plurality of memory cells according to claim 1.

12. A memory device comprising a plurality of memory cells according to claim 10.

* * * * *